United States Patent
Yan et al.

(10) Patent No.: US 9,664,973 B2
(45) Date of Patent: May 30, 2017

(54) ARRAY SUBSTRATE AND MANUFACTURING METHOD THEREOF, AND DISPLAY DEVICE

(71) Applicants: Beijing BOE Optoelectronics Technology Co., Ltd., Beijing (CN); BOE Technology Group Co., Ltd., Beijing (CN)

(72) Inventors: Changjiang Yan, Beijing (CN); Jing Li, Beijing (CN); Tiansheng Li, Beijing (CN); Zhenyu Xie, Beijing (CN); Xu Chen, Beijing (CN)

(73) Assignees: BEIJING BOE OPTOELECTRONICS TECHNOLOGY CO., LTD., Beijing (CN); BOE TECHNOLOGY GROUP CO., LTD, Beijing (CN)

( * ) Notice: Subject to any disclaimer, the term of this patent is extended or adjusted under 35 U.S.C. 154(b) by 483 days.

(21) Appl. No.: 14/348,359

(22) PCT Filed: Nov. 27, 2013

(86) PCT No.: PCT/CN2013/087943
§ 371 (c)(1),
(2) Date: Mar. 28, 2014

(87) PCT Pub. No.: WO2014/205997
PCT Pub. Date: Dec. 31, 2014

(65) Prior Publication Data
US 2016/0259190 A1 Sep. 8, 2016

(30) Foreign Application Priority Data
Jun. 28, 2013 (CN) .......................... 2013 1 0269302

(51) Int. Cl.
*H01L 27/12* (2006.01)
*G02F 1/1368* (2006.01)
(Continued)

(52) U.S. Cl.
CPC ........ *G02F 1/1368* (2013.01); *G02F 1/13439* (2013.01); *G02F 1/136209* (2013.01);
(Continued)

(58) Field of Classification Search
CPC ........... H01L 27/1248; H01L 29/78633; G02F 1/136209; G02F 2001/1351
(Continued)

(56) References Cited

U.S. PATENT DOCUMENTS

2001/0013915 A1* 8/2001 Song ................. G02F 1/134363
349/141
2003/0081159 A1 5/2003 Ha et al.
(Continued)

FOREIGN PATENT DOCUMENTS

CN 101127358 A 2/2008
CN 101424847 A 5/2009
(Continued)

OTHER PUBLICATIONS

Notification of the Second Office Action issued by the Chinese Patent Office for priority application CN2013102693024 mailed Oct. 8, 2015 with English translation.
(Continued)

*Primary Examiner* — Moazzam Hossain
(74) *Attorney, Agent, or Firm* — Haug Partners LLP

(57) ABSTRACT

The present invention discloses an array substrate and a manufacturing method thereof, and a display device, and relates to the field of display technology, in order to reduce the leakage current of the TFT, improve the stability of the TFT, and enhance the display effect of the display device.
(Continued)

The array substrate comprises: a transparent substrate, a TFT on the transparent substrate, a first passivation layer covering the TFT, a first transparent electrode on a surface of the first passivation layer, and a light blocking structure for preventing light transmission provided at a position, corresponding to a channel of the TFT, on a side of the TFT away from the transparent substrate.

11 Claims, 7 Drawing Sheets

(51) Int. Cl.
  *G02F 1/1362* (2006.01)
  *G02F 1/1343* (2006.01)
  *H01L 29/786* (2006.01)
(52) U.S. Cl.
  CPC ...... *H01L 27/1248* (2013.01); *H01L 27/1259* (2013.01); *H01L 29/78633* (2013.01)
(58) Field of Classification Search
  USPC .......................................................... 257/72
  See application file for complete search history.

(56) References Cited

U.S. PATENT DOCUMENTS

| | | | | |
|---|---|---|---|---|
| 2003/0164915 A1* | 9/2003 | Fujiwara | ........... | G02F 1/133553 349/122 |
| 2004/0266147 A1* | 12/2004 | Shimomura | ........ | H01L 21/2022 438/488 |
| 2009/0218571 A1 | 9/2009 | Chen et al. | | |
| 2009/0261332 A1* | 10/2009 | Shin | .................. | H01L 29/78633 257/59 |
| 2010/0289977 A1* | 11/2010 | Liu | .......................... | H01L 27/12 349/44 |
| 2011/0075081 A1* | 3/2011 | Ishida | .................. | G02F 1/1333 349/123 |
| 2011/0114957 A1* | 5/2011 | Kim | .................. | H01L 29/78633 257/59 |

FOREIGN PATENT DOCUMENTS

| | | |
|---|---|---|
| CN | 101447460 A | 6/2009 |
| CN | 101887897 A | 11/2010 |
| CN | 102654705 A | 9/2012 |
| CN | 202473925 U | 10/2012 |
| CN | 103018989 A | 4/2013 |
| CN | 103337497 A | 10/2013 |
| WO | WO 2012/096154 A | 7/2012 |

OTHER PUBLICATIONS

Notification of the First Office Action issued by Chinese Patent Office for priority application CN 201310269302.4 dated Apr. 3, 2015 with English translation.
International Search Report and Written Opinion prepared by SIPO as ISA during international phase of PCT/CN2013/087943 with English translation of Written Opinion.
Notification of the Third Office Action issued by the Chinese Patent Office for priority application CN2013102693024 mailed Apr. 5, 2016 with English translation.

* cited by examiner

ARRAY SUBSTRATE AND MANUFACTURING METHOD THEREOF, AND DISPLAY DEVICE

This application is a 371 of PCT/CN2013/087943 filed on Nov. 27, 2013, which claims priority benefits from Chinese Patent Application Number 201310269302.4 filed Jun. 28, 2013, the disclosure of which is incorporated herein by reference.

FIELD OF THE INVENTION

The present invention relates to the field of display technology, in particular to an array substrate and a manufacturing method thereof and a display device.

BACKGROUND OF THE INVENTION

With the rapid development of display technology, Thin Film Transistor Liquid Crystal Display (TFT-LCD), as a flat panel display device, has been increasingly applied to the field of high-performance display due to its small size, low power consumption, no radiation and relatively low production cost.

A manufacturing process of a TFT-LCD display panel comprises preparing an array substrate and a color filter substrate and then aligning the array substrate and the color filter substrate to form a cell. As illustrated in FIG. 1, a typical TFT array substrate comprises a transparent substrate 11; and a TFT gate 120, a gate insulation layer 13, an active layer 14, a TFT drain 121 and a TFT source 122 located at both sides of the active layer 14; a first passivation layer 15 located on surfaces of the active layer 14, the TFT drain 121 and the TFT source 122, a plate-shaped first transparent electrode 16 located on a surface of the first passivation layer 15, and a second passivation layer 17 and a slit-shaped second transparent electrode 18 formed sequentially on a surface of the first transparent electrode 16 located sequentially on a surface of the transparent substrate 11.

In existing technologies, as shown in FIG. 1, portions of the semiconductor active layer 14 and the gate insulation layer 13 are not covered by the TFT source 122 or the TFT drain 121 (shown as the area A in FIG. 1). Thus light directly irradiates the interface between the semiconductor active layer 14 and the gate insulation layer 13 without being reflected by a metal layer. In this way, the interface will be activated by external ambient light so that shallow energy levels of defects occur, carrier trapping effect takes place at the interface between the semiconductor active layer 14 and the gate insulation layer 13, and then relatively large leakage current is generated between the semiconductor active layer 14 and the gate insulation layer 13, thus affecting the stability of TFT and reducing display effect of the display device.

SUMMARY OF THE INVENTION

Embodiments of the present invention provide an array substrate and a manufacturing method thereof, and a display device, for reducing the leakage current of the TFT, improving the stability of the TFT, and enhancing the display effect of the display device.

To achieve the above objects, the embodiments of the present invention employ the technical solutions as below.

In one aspect of the embodiments of the present invention, there provides an array substrate, comprising a transparent substrate, a TFT on the transparent substrate, a first passivation layer covering the TFT, and a first transparent electrode on a surface of the first passivation layer, wherein a light blocking structure for preventing light transmission is provided at a position, corresponding to a channel of the TFT, on a side of the TFT away from the transparent substrate.

In another aspect of the embodiments of the present invention, there provides a display device, comprising the array substrate described above.

In still another aspect of the embodiments of the present invention, there provides a manufacturing method of an array substrate, comprising:

forming a TFT on a transparent substrate;

forming a light blocking structure for preventing light transmission at a position, corresponding to a channel of the TFT on a side of the TFT away from the transparent substrate, on the surface of the substrate formed with the TFT.

The embodiments of the present invention provide an array substrate and a manufacturing method thereof, and a display device. The array substrate comprises a transparent substrate, a TFT on the transparent substrate, a first passivation layer covering the TFT, a first transparent electrode on a surface of the first passivation layer, and a light blocking structure for preventing light transmission at a position, corresponding to a channel of the TFT, on a side of the TFT away from the transparent substrate. In the present invention, by providing the light blocking structure at the position, corresponding to the channel of the TFT on the side of the TFT away from the transparent substrate, light may be prevented from being transmitted to the channel uncovered by the source and the drain to enter the TFT, and thus the resulting leakage current of the TFT may be reduced, the stability of the TFT may be improved, and the display effect of display devices may be enhanced.

BRIEF DESCRIPTION OF THE DRAWINGS

To illustrate technical solutions of the embodiments of the present invention more clearly, the present invention will be described below in detail with reference to the following accompanying drawings.

DETAILED DESCRIPTION OF THE EMBODIMENTS

The technical solutions in the embodiments of the present invention will be described below clearly and completely in conjunction with the accompanying drawings. Apparently, the described embodiments are merely exemplary embodiments of the present invention, rather than enumerate all the embodiments that can implement the concept of the present invention. Based on the embodiments described in the present invention, all the other embodiments obtained by those skilled in the art without creative efforts are within the protection scope of the present invention.

Figure 2:
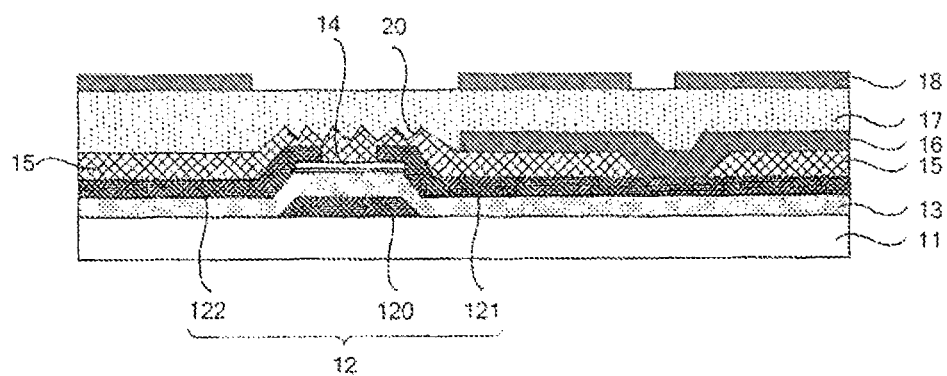
FIG. 2 is a schematic diagram of a structure of an array substrate according to a first embodiment of the present invention.

An array substrate according to the first embodiment of the present invention, as shown in FIG. 2, may comprise: a transparent substrate 11, a TFT 12 on the transparent substrate 11, a first passivation layer 15 covering the TFT 12, and a first transparent electrode 16 on a surface of the first passivation layer 15, wherein a light blocking structure 20 for preventing light transmission is provided at a position, corresponding to a channel of the TFT 12, on a side of the TFT 12 away from the transparent substrate 11, in the array substrate according to the embodiment of the present invention.

In the array substrate provided by the embodiment of the present embodiment, with the light blocking structure formed at the position corresponding to the channel of the TFT, light leakage phenomenon due to the fact that light directly irradiates the interface between the semiconductor active layer 14 and the gate insulation layer 13, which is not covered by the source 122 or the drain 121 of TFT, in the prior art may be effectively avoided. In this way, die leakage current of the TFT due to the fact that light directly irradiates the interface between the semiconductor active layer 14 and the gate insulation layer 13 may be reduced, the stability of the TFT may be improved, and the display effect of display devices may be enhanced.

According to the first embodiment of the present invention, as shown in FIG. 2, the light blocking structure 20 may include a microstructure having a plurality of continuous inclined faces or curved faces thereon, formed on the surface of the first passivation layer 15.

It should be noted that the microstructure having a plurality of continuous inclined faces or curved faces thereon described above may have a regular shape of serration or an irregular shape of uneven serration. Herein, the embodiments of the present invention are described by taking an irregular shape of serration as an example, but the present invention is not limited thereto.

It should be noted that the light blocking structure 20 with a serrated surface may be formed at a position, corresponding to the channel of the TFT 12, on the surface of the first passivation layer 15 by a patterning process. For example, a microstructure having an irregular shape of serration may be formed at the position, corresponding to the channel of the TFT 12, on the surface of the first passivation layer 15 by performing ion bombardment etching at the position corresponding to the channel of the TFT 12 on the substrate formed with the first passivation layer 15, and then performing an ashing process on the photoresist; or the microstructure having an irregular shape of serration may be formed by roughening the surface of the first passivation layer 15.

Figure 1:
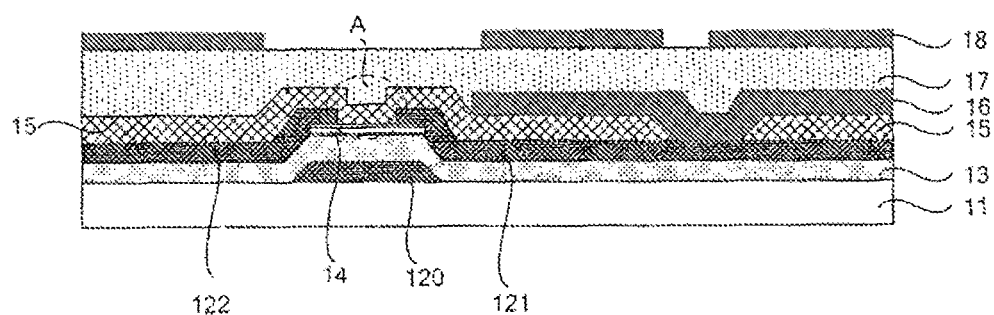
FIG. 1 is a schematic diagram of a structure of an array substrate in the prior art.

In this way, when light irradiates an area of the semiconductor active layer 14 and the gate insulation layer 13 uncovered by the source 122 or the drain 121 of the TFT (shown as the area A of FIG. 1), incident light is scattered by the light blocking structure 20 with surface being of an irregular shape of serration, which reduces the light that transmits through the area A, thus avoiding the light leakage phenomenon of the display device, reducing the leakage current of the TFT, improving the stability of the TFT, and enhancing the display effect of the display device.

It should be noted that, the patterning process in the present invention may include a photolithography process, or include a photolithography process and an etching process, and may farther include printing, ink-jetting and other process for forming a predetermined pattern; the photolithography process is a process which forms a pattern using photoresist, a mask plate, an exposure machine and the like and includes film forming, exposing, developing and other processes. The patterning process may be selected according to the structure formed in the present invention.

In addition, a second passivation layer 17 is formed on a surface of the first transparent electrode 16, and a second transparent electrode 18 is formed on a surface of the second passivation layer 17.

Specifically, the first transparent electrode 16 may be a plate-like structure, and the second transparent electrode 18 may be a slit-like structure in which slits are spaced apart from each other; or, the first transparent electrode 16 may be a slit-like structure in which slits are spaced apart from each other, and the second transparent electrode 18 may be a plate-like structure; or both the first transparent electrode 16 and the second transparent electrode 18 may be slit-like structures.

For example, the array substrate provided by the embodiment of the present invention may apply to a liquid crystal display (LCD) device of Fringe Field Switching (FFS) type, Advanced-Super Dimensional Switching (AD-SDS, referred to as ADS for short) type, or other types. For example, when both the first transparent electrode 16 and the second transparent electrode 18 are slit-like structures in which slits are spaced apart from each other, the array substrate with such a structure is generally used for an ADS-type LCD device. In an ADS-type LCD, multi-dimensional electric field is formed by parallel electric field generated by edges of pixel electrodes in the same plane and longitudinal electric filed generated between a pixel electrode layer and a common electrode layer, and enables all the orientated liquid crystal molecules between the pixel electrodes and right above the electrodes in a liquid crystal cell to produce rotation transformation. Compared with display devices of other types, ADS-type LCD devices further improve the operating efficiency of in-plane orientation of liquid crystal molecules and increase the light transmission efficiency.

It should be noted that, in the embodiments of the present invention, the first transparent electrode 16 may be a pixel electrode, and the second transparent electrode 18 may be a common electrode; or the first transparent electrode 16 may be a common electrode, and the second transparent electrode 18 may be a pixel electrode. There is no limit thereto in the present invention.

With such an array substrate described above, the light blocking structure 20 is a light reflecting structure formed by the first passivation layer 15. In tins way, the light blocking structure may be realized by only changing the shape of the portion corresponding to the TFT channel of the existing layered structure, without providing a new layer additionally, which effectively limits thickness of the display device.

Alternatively, the light blocking structure 20 may further include a light shielding layer 21.

Figure 3A:
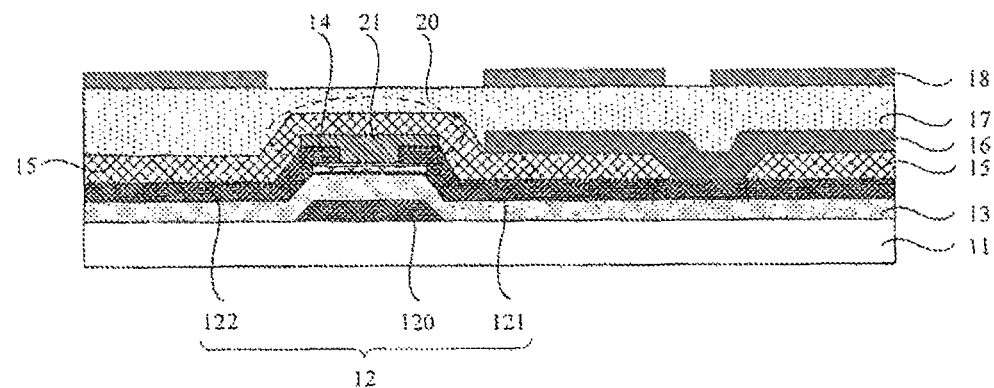
FIG. 3a is a schematic diagram of a structure of an array substrate according to a second embodiment of the present invention.

According to the second embodiment of the present invention, as shown in FIG. 3*a*, the light shielding layer 21 is located between the TFT 12 and the first passivation layer 15. It should be noted that, the light shielding layer 21 may shield portions of the semiconductor active layer 14 and the gate insulation layer 13 uncovered by the source 122 or the drain 121 of the TFT 12, and thus the light shielding layer 21 formed at the position corresponding to the channel of the TFT 12 may serve as the light blocking structure 20. Herein, the surface of the light shielding layer 21 may be formed with an irregular shape of serration by a patterning process, and thus the passivation layer 15 also has the irregular shape of serration at the position, corresponding to the channel of the TFT 12, on the surface of the light shielding layer. The shapes of the surfaces of the light shielding layer and the first passivation layer at the position corresponding to the channel are not limited, for example, as shown in FIG. 3*b*, the light shielding layer 21 has a flat surface, while the first passivation layer 15 formed thereon has an irregular shape of serration.

Figure 4:
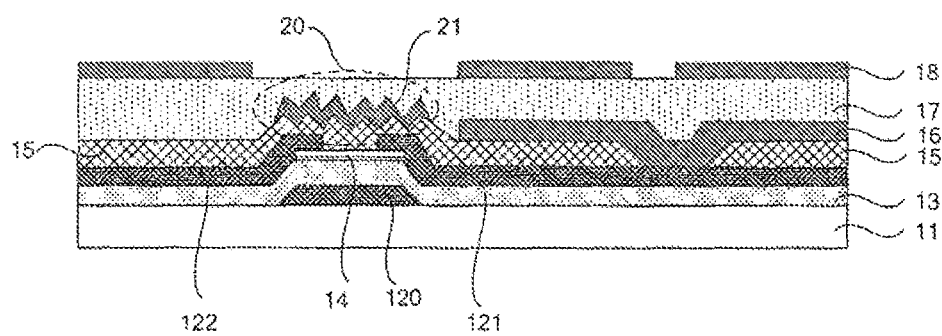
FIG. 4 is a schematic diagram of a structure of an area substrate according to a third embodiment of the present invention.

According to the third embodiment of the present invention, as shown in FIG. 4, the light shielding layer 21 may be located between the first passivation layer 15 and the second passivation layer 17, it should be noted that, the first passivation layer 15 and the light shielding layer 21 are formed layer by layer above the position corresponding to the channel of the TFT 12 on the surface of the substrate formed with the TFT 12 by a patterning process. When the first passivation layer 15 at said position is formed to be of the irregular shape of serration as shown in FIG. 4 by a patterning process, the light shielding layer 21 formed on the surface of the first passivation layer 15 will have the same irregular shape of serration. Since the first passivation layer 15 and the light shielding layer 21 may be made from materials with certain light refractive indices, both portions of the first passivation layer 15 and the shielding layer 21 at the position corresponding to the channel of the TFT 12 may together serve as the light blocking structure 20.

Figure 3B:
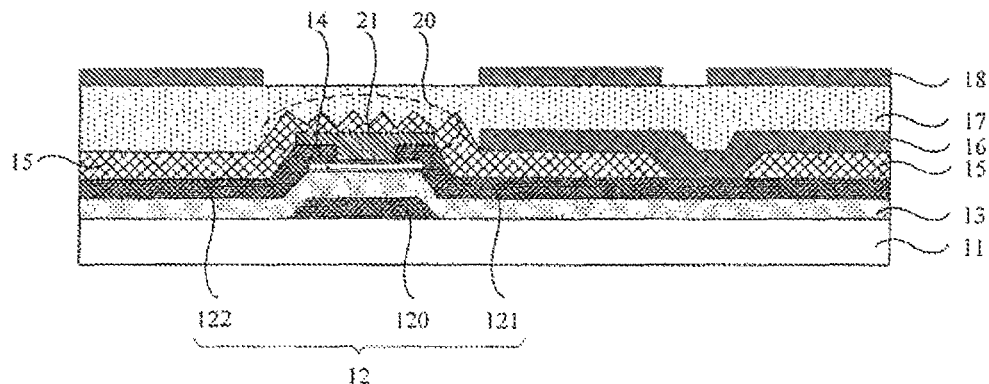
FIG. 3b is a schematic diagram of a structure of anther array substrate according to the second embodiment of the present invention.

Further, material for making the light shielding layer 21 between the TFT and the first passivation layer 15 as shown in FIGS. 3*a* and 3*b* includes resin material; or as shown in FIG. 4, material for making the light shielding layer 21 between the first passivation layer 15 and the second passivation layer 17 includes resin material or metal material. The metal material, for example, is at least one of molybdenum, titanium, and aluminum. In this way, the light shielding layer 21 for shielding the portions of the semiconductor active layer 14 and the gate insulation layer 13 which are not covered by the source 122 or the drain 121 of the TFT may achieve the function of preventing light transmission or reflecting incident light, thus avoiding the light leakage phenomenon of the display panel, reducing the leakage current of the TFT, improving the stability of the TFT, and enhancing the display effect of the display device.

The embodiments of the present invention provide a display device, comprising any one of the array substrates described above. Specifically, the display device may be any LCD product or component having display function, such as LCD, LCD television, digital photo frame, cell phone, tablet PC and the like.

The embodiments of the present invention provide a display device, comprising an array substrate, which comprises a transparent substrate, a TFT on the transparent substrate, a first passivation layer covering the TFT, a first transparent electrode on a surface of the first passivation layer, and a light blocking structure for preventing light transmission provided at a position, corresponding to a channel of the TFT, on a side of the TFT away from the transparent substrate. In this way, with the light blocking structure, the leakage current of the TFT may be reduced, the stability of the TFT may be improved, and the display effect of the display device may be enhanced.

Figure 5:
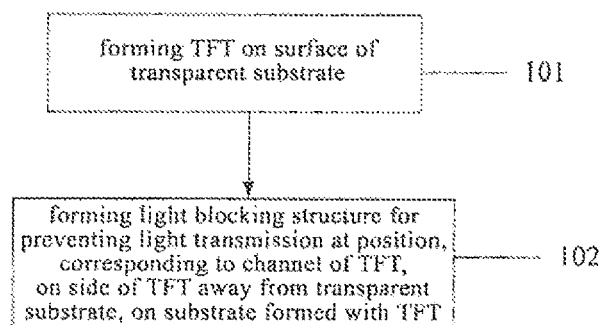
FIG. 5 is a flow chart of a manufacturing method of an array substrate according to a fourth embodiment of the present invention.

According to the fourth embodiment of the present invention, a manufacturing method of an array substrate is provided, and as shown in FIG. 5, comprises:

S101, forming a TFT on a transparent substrate; and

S102, forming a light blocking structure for prevent light transmission at a position, corresponding to a channel of the TFT, on a side of the TFT away from the transparent substrate, on the substrate formed with the TFT.

The embodiment of the present invention provides a manufacturing method of an array substrate, the array substrate comprising a transparent substrate, a TFT on the transparent substrate, a first passivation layer covering the TFT, a first transparent electrode on a surface of the first passivation layer, and a light blocking structure for preventing light transmission at a position, corresponding to a channel of the TFT, on a side of the TFT away from the transparent substrate. In this way, light from front side may be prevented from being transmitted to the channel uncovered by a source or a drain of the TFT, thus reducing the resulting leakage current of the TFT, improving the stability of the TFT, and enhancing the display effect of the display device.

Figure 6:
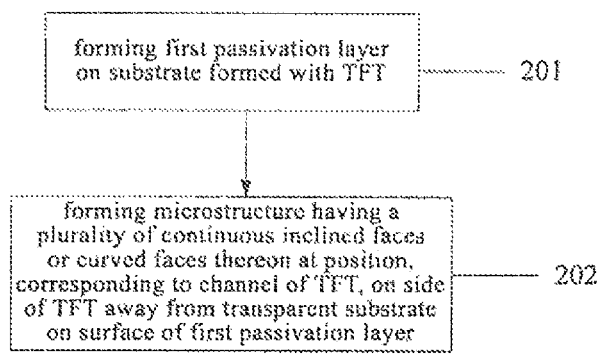
FIG. 6 is a flow chart of a manufacturing method of an array substrate according to a fifth embodiment of the present invention.

Further, as shown in FIG. 6 and in conjunction with FIG. 2, a manufacturing method of an array substrate according to the fifth embodiment of the present invention may comprise:

S201, forming a first passivation layer 15 on a substrate formed with a TFT; and S202, forming a microstructure having a plurality of continuous inclined faces or curved faces thereon at a position, corresponding to a channel of the TFT, on a side of the TFT away from the transparent substrate, on the surface of the first passivation layer 15.

It should be rioted that the microstructure having a plurality of continuous inclined faces or curved faces thereon described above may have a regular shape of serration or an irregular shape of uneven serration. Herein, the embodiments of the present invention are described by taking the irregular shape of serration as an example.

Specifically, as shown in FIG. 2, the portion of the first passivation layer 15 at the position corresponding to the channel of the TFT 12 serves as the tight blocking structure 20 with surface being of an irregular shape of serration. In this way, when light irradiates an area of the semiconductor active layer 14 and the gate insulation layer 13 uncovered by the source 122 or the drain 121 of the TFT (shown as the area A in FIG. 1) from the front side, incident light is scattered by the light blocking structure 20 with surface being of irregular shape of serration, which reduces the light that transmits through the area A, thus avoiding light leakage phenomenon of the display device, reducing the leakage current of to TFT, improving the stability of the TFT, and enhancing the display effect of the display device.

Alternatively, the light blocking structure 20 for preventing light transmission provided at the position corresponding to the channel of the TFT 12 may include a light shielding layer 21.

For example, as shown in FIGS. 3a and 3b, the light shielding layer 21 may be located on the substrate formed with the TFT 12. It should be noted that the light shielding layer 21 may shield portions of the semiconductor active layer 14 and the gate insulation layer 13 uncovered by the source 122 or the drain 121 of the TFT, thus the light shielding layer 21 formed at the position corresponding to the charnel of the TFT 12 may serve as the light blocking structure 20.

Alternatively, as shown in FIG. 4, the light shielding layer 21 may be located on the substrate formed with the first passivation layer 15. It should be rioted that, the first passivation layer 15 and the light shielding layer 21 may be formed layer by layer above the position corresponding to the channel of the TFT 12 on the surface of the substrate formed with the TFT 12 by a patterning process. When the first passivation layer 15 is formed to be of the irregular shape of serration at said position as shown in FIG. 4 by a patterning process, the light shielding layer 21 formed on the surface of the first passivation layer 15 will have the same irregular shape of serration. Since the first passivation layer 15 and the light shielding layer 21 may be made from materials with certain light refractive indices, both portions of the first passivation layer 15 and the light shielding layer 21 at the position corresponding to the channel of the TFT 12 may together the light blocking structure 20.

Further, material for making the light shielding layer 21 between the TFT and the first passivation layer 15 as shown in FIGS. 3a and 3b includes resin material; or as shown in FIG. 4, material for making the light shielding layer 21 between the first passivation layer 15 and the second passivation layer 17 includes resin material or metal material. The metal material, for example, is at least one of molybdenum, titanium, and aluminum. In this way, the light shielding layer for shielding the portions of the semiconductor active layer 14 and the gate insulation layer 13 uncovered by the source 122 or the drain 121 of the TFT may achieve the function of preventing light transmission or reflecting incident light, thus avoiding the light leakage phenomenon of the display panel, reducing the leakage current of the TFT, improving the stability of the TFT, and enhancing the display effect of the display device.

Figure 7:
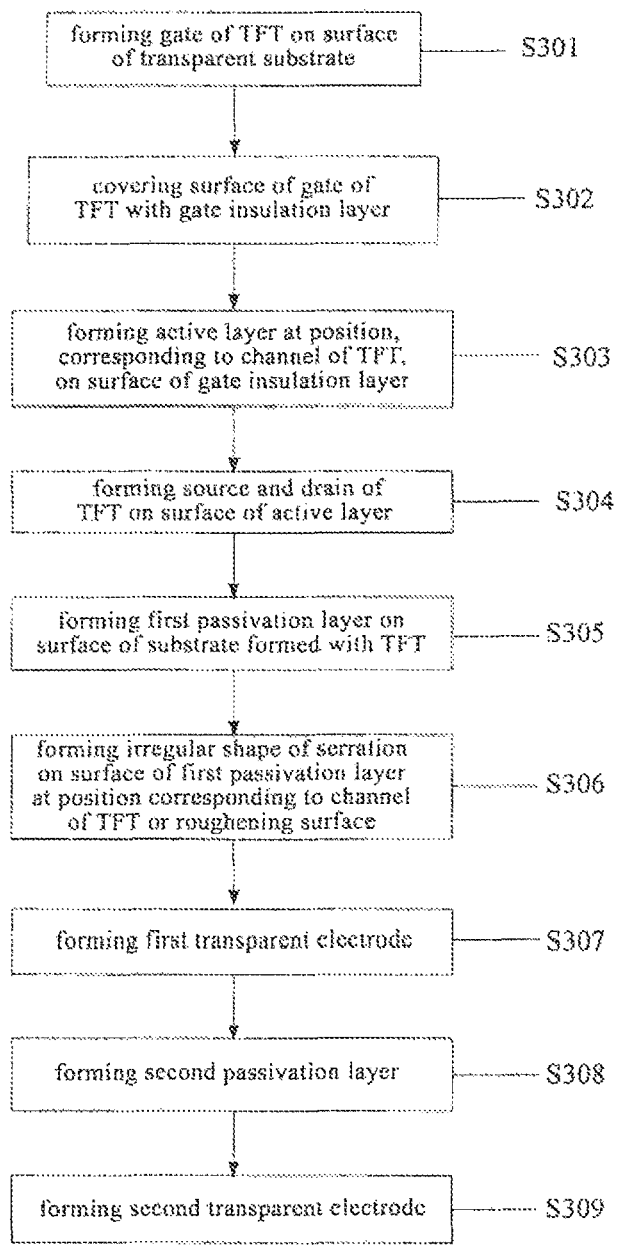
FIG. 7 is a flow chart of a manufacturing method of an array substrate according to a sixth embodiment of the present invention.

Specifically, referring to FIG. 7 and in conjunction with FIG. 2, a manufacturing method of an array substrate according to the sixth embodiment of the present invention comprises:

S301, forming a pattern of a gate 120 of a TFT on a surface of a transparent substrate 11 by a patterning process;

S302, covering a surface of the gate 120 of the TFT with a gate insulation layer 13;

S303, forming a semiconductor active layer 14 at a position, corresponding to a channel of the TFT 12, on a surface of the gate insulation layer 13 using a lift-out process, the semiconductor active layer 14 being of metal oxide (IGZO);

S304, forming a source 122 and a drain 121 of the TFT on a surface of the semiconductor active layer 14, and after this step, finishing fabrication of the TFT 12;

S305, forming a pattern of a first passivation layer 15 on the surface of the substrate formed with the TFT 12;

S306, forming an irregular shape of serration on a surface of the first passivation layer 15 at a position corresponding to a channel of the TFT 12 by using a specially designed mask plate or a dry etching process on the surface of the substrate formed with the above pattern, or roughening a portion, corresponding to the channel of the TFT 12, of the surface of the first passivation layer 15;

S307, forming a first transparent electrode 16 on the surface of the substrate formed with the above pattern, thus forming a light blocking structure 20 for preventing light transmission at the position corresponding to the channel of the TFT 12;

S308, forming a second passivation layer 17 on the surface of the substrate formed with the first transparent electrode 16; and S309, forming a second transparent electrode 18 on the surface of the substrate formed with the second passivation layer 17.

With such an array substrate described above, the light blocking structure 20 is a light reflecting structure formed by the first passivation layer 15. In this way, the light blocking structure may be realized by only changing the shape of the portion corresponding to the TFT channel of the existing layered structure, without setting a new layer additionally, which effectively limits thickness of the display device.

Figure 8:
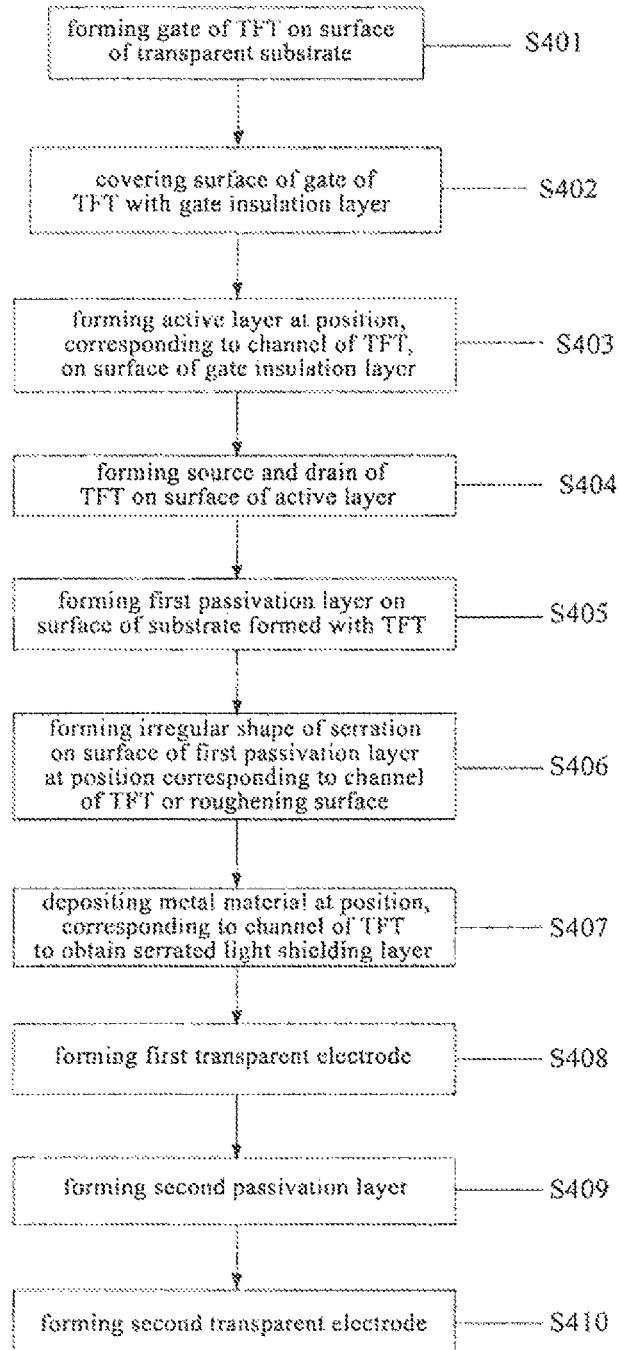
FIG. 8 is a flow chart of a manufacturing method of an array substrate according to a seventh embodiment of the present invention
Figure 9:
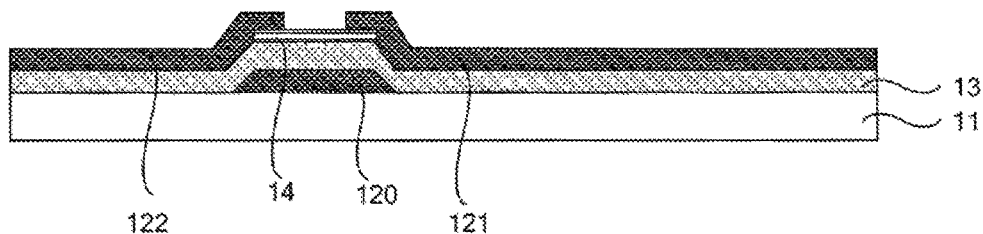
FIG. 9 is a schematic diagram of forming a thin film transistor of an array substrate according to an embodiment of the invention.
Figure 10:
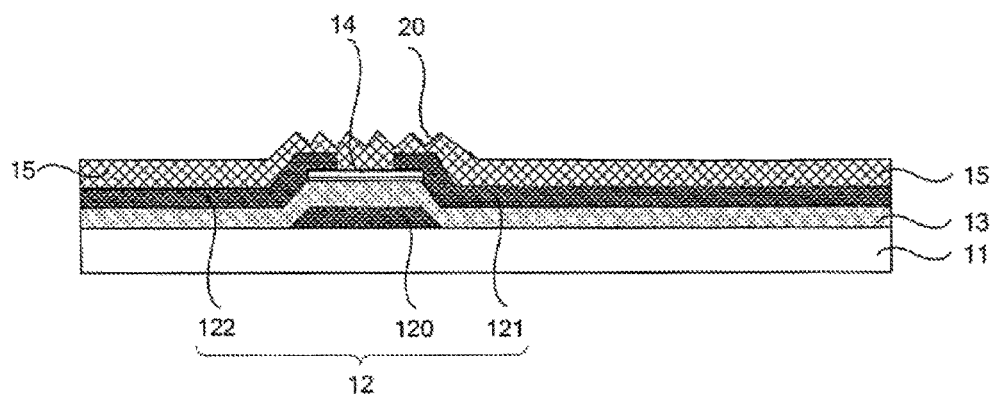
FIG. 10 is a schematic diagram of forming a light blocking structure and a first passivation layer of an array substrate according to an embodiment of the invention.
Figure 11:
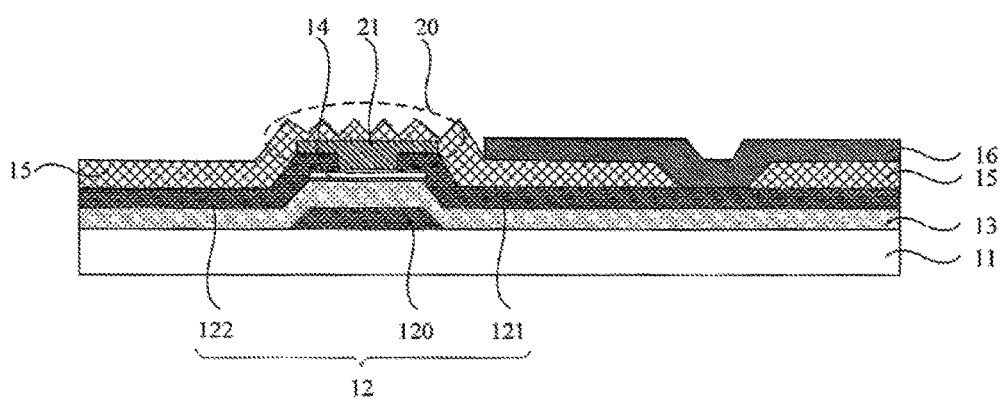
FIG. 11 is a schematic diagram of forming a light shielding layer of an array substrate according to an embodiment of the invention.
Figure 12:
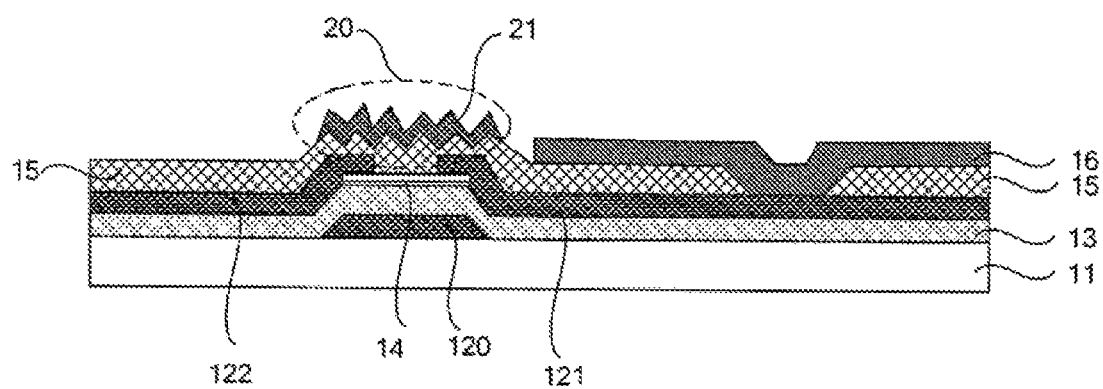
FIG. 12 is a schematic diagram of forming a light shielding layer of an array substrate according to another embodiment of the invention.

Alternatively, referring to FIG. 8 and in conjunction with FIG. 4, a manufacturing method of an array substrate according to the seventh embodiment of the present invention comprises:

S401, forming a pattern of a gate 120 of a TFT on a surface of a transparent substrate 11 by a patterning process;

S402, covering a surface of the gate 120 of the TFT with a gate insulation layer 13;

S403, forming a semiconductor active layer 14 at a position, corresponding to a channel of the TFT 12, on a surface of the gate insulation layer 13 by a lift-out process, the semiconductor active layer 14 being of metal oxide (IGZO);

S404, forming a source 122 and a drain 121 of the TFT on a surface of the semiconductor active layer 14, and after this step, finishing fabrication of the TFT 12;

S405, forming a pattern of a first passivation layer 15 on the surface of the substrate formed with the TFT 12;

S406, forming an irregular shape of serration on a surface of the first passivation layer 15 at a position corresponding to a channel of the TFT 12 by using a specially designed mask plate or a dry etching process at the position on the surface of the substrate formed with the above pattern, or roughening a portion of the surface of the first passivation layer 15 corresponding to the channel of the TFT 12;

S407, depositing metal material at a position, corresponding to the channel of the TFT 12, on the surface of the substrate formed with the above structure, as a result of which, grains with coarse texture and large size may be formed, so as to obtain a structure of serration, thus finishing fabrication of a light shielding layer 21;

S408, forming a first transparent electrode 16 on the surface of the substrate formed with the above pattern, thus forming a light blocking structure 20 for preventing light transmission at the position corresponding to the channel of the TFT 12;

S409, forming a second passivation layer 17 on the surface of the substrate formed with the first transparent electrode 16; and S410, forming a second transparent electrode 18 on the surface of the substrate formed with the second passivation layer 17.

It should be noted that the above methods are merely examples of the manufacturing methods of the array substrates shown in FIGS. 2 and 4, other manufacturing methods of the array substrate with the light blocking structure 20 will not be elaborated herein, but should be within the protection scope of the present invention.

The above descriptions are merely specific embodiments of the present invention. However, the protection scope of the present invention is not limited thereto. Variations or alternatives which are easily thought of by those skilled in the art within the scope of the disclosure of the present invention should be covered by the protection scope of the present invention. Therefore, the protection scope of the present invention depends on that of the appending claims.

The invention claimed is:

1. An array substrate, comprising a transparent substrate, a thin film transistor on the transparent substrate, a first passivation layer covering the thin film transistor, and a first transparent electrode on a surface of the first passivation layer;
wherein the array substrate further comprises a light blocking structure for preventing light transmission provided at a position, corresponding to a channel of the thin film transistor, on a side of the thin film transistor away from the transparent substrate; and
wherein a portion of the first passivation layer at the position corresponding to the channel of the thin film transistor serves as the light blocking structure, and the portion of the first passivation layer has a surface being of an irregular shape of serration.

2. The array substrate of claim 1, wherein the light blocking structure includes a light shielding layer located between the thin film transistor and the first passivation layer.

3. The array substrate of claim 2, wherein material of the light shielding layer includes resin material.

4. The array substrate of claim 1, further comprising a second passivation layer formed on a surface of the first transparent electrode, wherein the light blocking structure comprises a light shielding layer located between the first passivation layer and the second passivation layer.

5. The array substrate of claim 4, wherein material of the light shielding layer includes resin material or metal material.

6. A display device, comprising the array substrate of claim 1.

7. A manufacturing method of an array substrate, comprising:
forming a thin film transistor on a transparent substrate;
forming a light blocking structure for preventing light transmission at a position corresponding to a channel of the thin film transistor on a surface of the substrate formed with the thin film transistor and at a side of the thin film transistor away from the transparent substrate,
wherein the step of forming a light blocking structure for preventing light transmission at a position corresponding to a channel of the thin film transistor on a surface of the substrate formed with the thin film transistor and at a side of the thin film transistor away from the transparent substrate comprises:
forming a first passivation layer on the surface of the substrate formed with the thin film transistor so that a portion of the first passivation layer at the position corresponding to the channel of the thin film transistor serves as the light blocking structure, and the portion of the first passivation layer has a surface being of an irregular shape of serration.

8. The manufacturing method of claim 7, further comprising:
forming a light shielding layer on the portion of the first passivation layer at the position corresponding to the channel of the thin film transistor.

9. The manufacturing method of claim 8, wherein material of the light shielding layer includes resin material or metal material.

10. The manufacturing method of claim 9, wherein before the step of forming a first passivation layer on the surface of the substrate formed with the thin film transistor so that a portion of the first passivation layer at the position corresponding to the channel of the thin film transistor serves as the light blocking structure, and the portion of the first passivation layer has a surface being of an irregular shape of serration, the manufacturing method further comprises:
forming a light shielding layer at the position, corresponding to the channel of the thin film transistor, on the surface of the substrate formed with the thin film transistor.

11. The manufacturing method of claim 10, wherein material of the light shielding layer includes resin material.

* * * * *